United States Patent [19]

Kenney

[11] 3,800,204

[45] Mar. 26, 1974

[54] CONTACTLESS SELECTOR SWITCH

[75] Inventor: Phillip E. Kenney, Glen Ellyn, Ill.

[73] Assignee: Ledex Inc., Dayton, Ohio

[22] Filed: Mar. 16, 1973

[21] Appl. No.: 342,182

[52] U.S. Cl. ..... 318/480, 250/219 DD, 250/231 SE

[51] Int. Cl. .......................................... H02p 11/00

[58] Field of Search. 318/480; 250/219 DD, 231 SE

[56] References Cited

UNITED STATES PATENTS

| | | | |
|---|---|---|---|
| 3,723,748 | 3/1973 | Coburn | 250/233 |
| 3,598,933 | 8/1971 | Walser | 250/219 DD X |
| 2,268,133 | 12/1941 | Carlson | 250/219 DD UX |
| 3,117,266 | 1/1964 | Raymond | 318/567 |
| 3,388,303 | 6/1968 | Rommel | 318/480 X |

*Primary Examiner*—B. Dobeck
*Attorney, Agent, or Firm*—Dybvig & Dybvig

[57] ABSTRACT

A contactless switch mechanism for successively energizing individual load devices selected from a plurality of load devices comprises confronting printed circuit boards, each making contact along one margin with a supporting chassis assembly which houses, or may have terminals for connection to, a source of operating power and which houses or may have terminal connections to the plurality of load devices. A first printed circuit board supports a plurality of continuously operating light-emitting devices, one light-emitting device for each load device, the light-emitting devices positioned in a predetermined array and each mounted to direct light toward the second printed circuit board. The second printed circuit board supports a plurality of light detector devices, one associated with each light-emitting device, and each responsive to light received from its associated light-emitting device. Each light detector is coupled to a solid state driver circuit responsive to the associated light detector to energize a load device coupled thereto. Each of the plurality of light-emitters is thus capable of causing energization of an associated load device without a mechanical movement such as normally required for the closure of switch contact. Interposed between the confronting printed circuit boards is a light shield having a single aperture. Selection of individual loads to be energized from amongst the plural loads available for energization is accomplished by means of a stepping motor operated to advance the light shield along a predetermined course and through plural positions along said course, each of said plural positions aligning said aperture. With a single one of said light emitters so as to allow energization of a single load device.

15 Claims, 11 Drawing Figures

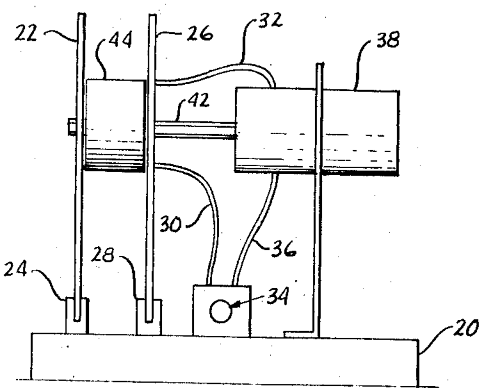
FIG. 1
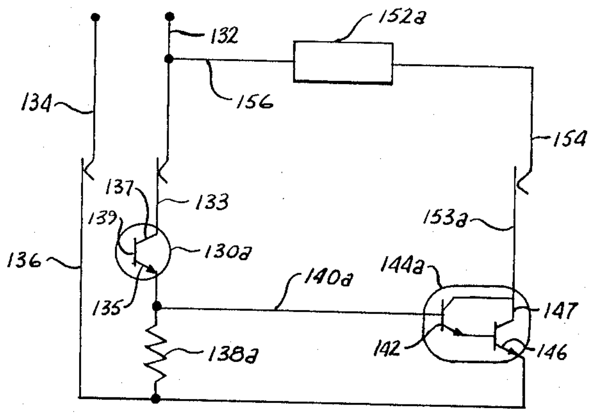
FIG. 5
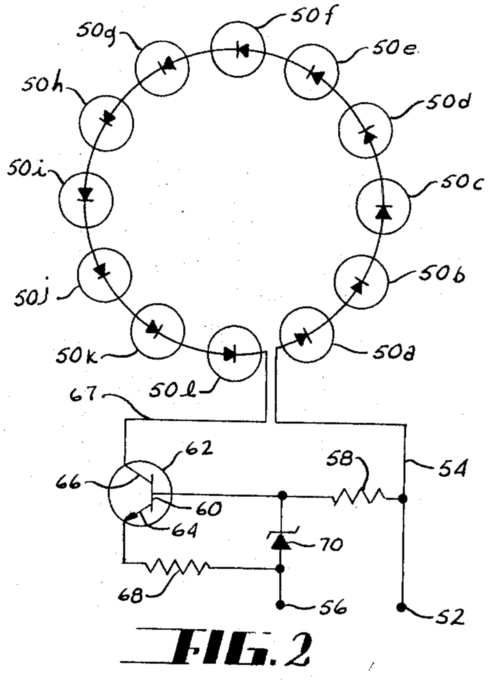
FIG. 2
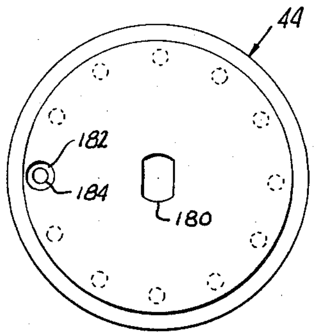
FIG. 8
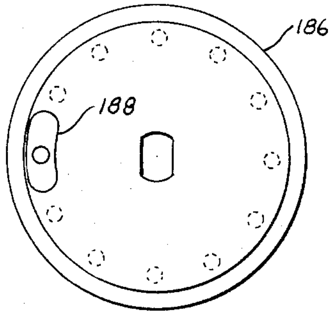
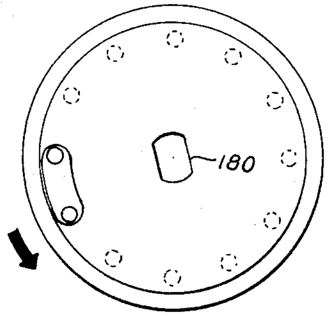
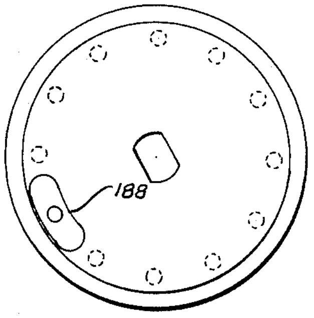
FIG. 9 FIG. 10 FIG. 11

CONTACTLESS SELECTOR SWITCH

BACKGROUND OF THE INVENTION

1. Field of the Invention

This invention relates to devices for selectively operating individual loads selected from among a plurality of loads and more particularly to such a device in which the load selection is accomplished by the emission of light from a light emitter to a light detector and in which load energization occurs without the mechanical movement of switch contacts.

2. Description of the Prior Art

It has been known to control the operation of selected load devices by the emission of light from a light emitter to a selected light detector. Examples can be found in U.S. Pat. Nos. 3,117,266; 3,104,351 and 2,479,031. A problem common to this prior art is that the operation initiated by the admission of light to a selected-detector element involves a mechanical switch movement which limits the life and reliability of the load selector mechanism.

SUMMARY OF THE INVENTION

In the present invention the selection and energization of a load device is accomplished by the admission of light to a selected light detector and the use of solid state devices responsive to the light detector output to energize the load device without switch movement in the load energizing circuit.

An object of the present invention is to provide a contactless switch mechanism.

Another object of the present invention is to provide a contactless switch mechanism for selectively energizing individual load devices selected from among a plurality of load devices.

A further object of the present invention is to provide a rotary switch mechanism for selectively energizing individual load devices selected from among a plurality of load devices, said switch mechanism characterized by an absence of moving contacts in the circuitry by which electrical power is supplied to the selected load devices.

A still further object of this invention is to provide a new design and arrangement of circuit boards to support the contactless switch mechanism.

BRIEF DESCRIPTION OF THE DRAWINGS

In the drawings:

FIG. 1 is a side elevation view of a contactles selector switch constructed in accordance with the present invention.

FIG. 2 is a schematic illustration of light-emitter circuitry suitable for use in accordance with the present invention.

FIG. 5 is a schematic view illustrating a light detector and load driver circuit suitable for use in the present invention.

FIG. 8 is a plan view illustrating one face of a light shield suitable for use in the practice of the present invention.

FIG. 9 is a plan view illustrating one face of a modification.

FIG. 10 is a plan view illustrating a second position of the modification.

FIG. 11 is a plan view illustrating a third position of the modification.

DESCRIPTION OF THE PREFERRED EMBODIMENTS

Figure 6:
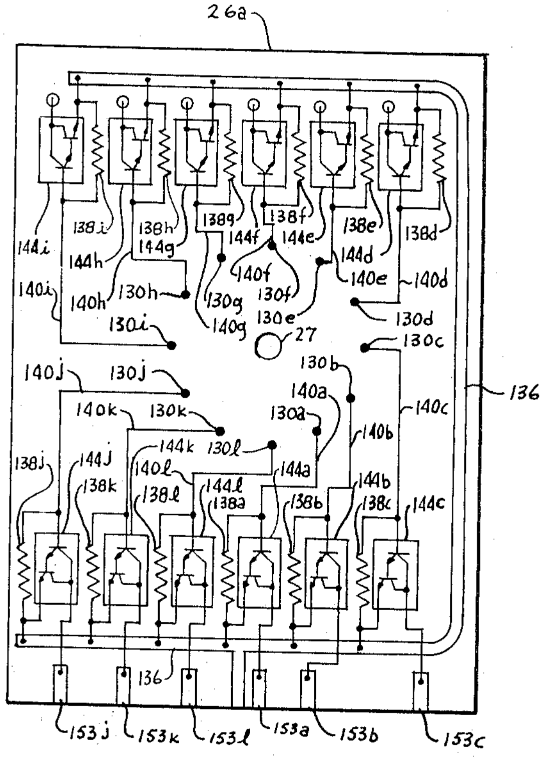
FIG. 6 is a plan view illustrating circuitry on one face of a circuit board for supporting the light detector and load driver circuit of FIG. 5, discrete components assembled to the circuit board being illustrated diagrammatically.

FIG. 1 illustrates a selector switch in accordance with the present invention assembled upon a supporting chassis 20. The selector switch includes a light-emitter board 22 supporting printed circuit elements to be described subsequently which make marginal contact along one edge with a supporting socket 24. The socket 24 is of a conventional construction having spring-loaded contact fingers (not shown) adapted to wipe the margin of a circuit board inserted therein to make electrical contact with conductive areas printed on the circuit board. A detector board 26 supports light detector circuitry and has printed elements along one margin thereof making electrical contact with a second supporting socket 28 also having spaced contact fingers (not shown) making electrical connection to selected areas of the detector board 26.

The detector board 26 will be described more fully in a later portion of this specification, and it suffices to note at this point that a voltage is delivered to the detector board 26 through the socket 28 and rendered available on one face 26*b* of the board for use in energizing a stepping motor 38. There is thus soldered to said face 26*b* a wire 30 leading to a push-button command switch 34 connected to the stepping motor 38 by a wire 36. There is also a second wire 32 soldered to the detector board 26 and connecting directly to the stepping motor 38 so as to complete an operating circuit for the stepping motor 38 which derives its operating voltage from that rendered available on the board 26. As well known in the art, a single manual depression of the command switch 34 will cause the stepping motor 38 to execute a single step, either clockwise or counterclockwise depending upon the design of the stepping motor. Upon release of the pressure applied to the command switch 34, the stepping motor prepares itself for execution of a second step in the same direction of rotation upon a subsequent depression of the switch 34. A stepping motor of a type suitable for use in the practice of the present invention is more fully disclosed in U.S. Pat. No. 3,320,822.

The basic electrical circuitry embodied in the emitter board 22 is illustrated schematically in FIG. 2. The circuit comprises 12 diode light emitters numbered 50*a* through 50-1. Diode light emitters of a type suitable for the practice of the present invention are marketed by Motorola Semiconductor Products Division, Phoenix, Arizona under the model designation MLED 910. The 12 light emitters are arranged in a circular array concentric with an aperture 23 passing through the emitter board 22. The diodes are spaced at equal 30° intervals circumferentially about the aperture 23. As known to those skilled in the art, the diodes are provided with a metallic part, not illustrated, which serves as an anode connection to the diode and which supports a lens, not illustrated, for focusing light emitted by the diode to a narrow beam. The lens is disposed to one end of the diode and a cathode terminal projects from the opposite end of the diode.

As appears in FIG. 2, the diodes are serially connected between conductors 54 and 67. The conductor 54 is directly connected to a source of positive voltage applied to a terminal 52. A source of negative voltage is applied to the terminal 56. A transistor 62 having a base 60, an emitter 64 and a collector 66 is assembled with its base connected to the positive voltage supply through a resistor 58 and with its emitter connected to the negative voltage supply through a resistor 68. A Zener diode 70 is connected between the base 60 and the negative voltage supplied at the terminal 56. The combination of elements comprising the resistors 58 and 68, the Zener diode 70 and the transistor 62, assembled as shown, delivers an essentially constant current to the light-emitting diodes.

Upon the application of an adequate direct current voltage across the terminals 52 and 56, the transistor 62 is biased to a conductive state, whereupon all twelve of the series-connected diodes 50*a* through 50-1 emit focused beams of light. As will be more fully described in a later portion of this specification, all twelve of the diodes 50*a* through 50-1 continuously emit light.

Figure 3:
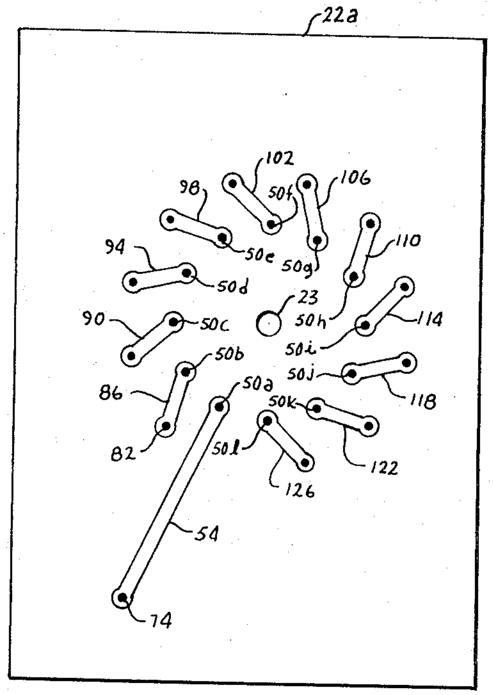
FIG. 3 is a plan view of printed circuitry on one face of a circuit board for supporting the light-emitter circuitry of FIG. 2.
Figure 4:
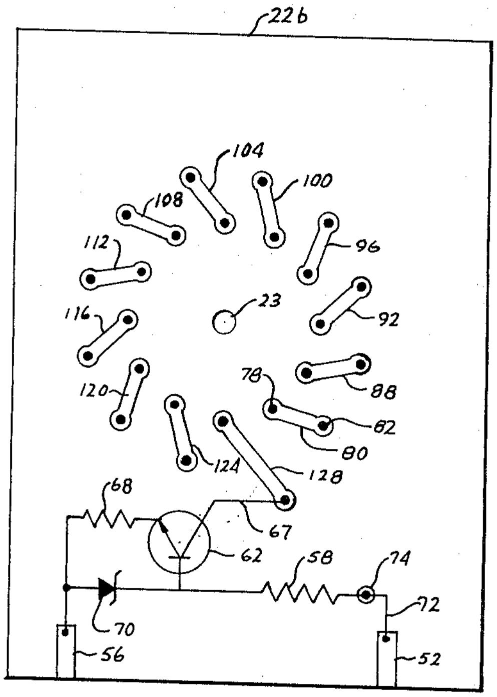
FIG. 4 is a plan view of the circuitry on the opposite face of the circuit borad illustrated in FIG. 3, discrete components assembled to such printed circuit board being diagrammatically illustrated.

FIGS. 3 and 4 illustrate the two faces 22*a* and 22*b* of the emitter board 22. The face 22*a* illustrated in FIG. 3 may be referred to as the lens side or anode side of the board 22. Likewise the face 22*b* illustrated in FIG. 4 may be referred to as the cathode side of the board 22.

The terminal 52 shown schematically in FIG. 2 appears in FIG. 4 as a printed conductor 52 placed at the lower margin of the face 22*b*. A conductor 72 connects from the printed conductor 52 to a solder plug 74 passing through the thickness of the emitter board 22. The plug 74 emerges from the opposite side of the emitter board at a point where it electrically contacts the conductor 54 which appears in FIG. 3 as an elongated printed conductor electrically contacting the anode of the diode 50*a*. The metallic annulus which is the anode for the diode 50*a* is snugly fitted in a suitably sized bore through the emitter board 22 and the cathode terminal for the diode 50*a* projects through the bore to the face 22*b* of the emitter board where the cathode terminal is identified by the reference number 78. The terminal 78 makes electrical contact to a printed island 80. A solder plug 82 extends through the thickness of the board from the island 80 to electrically contact an island 86 located on the face 22*a* of the emitter board 22. The island 86 makes electrical contact to the anode for the diode 50*b*. The described pattern is continued through the thickness of the board to the island 88, which makes a cathode connection to the diode 50*b* and back through the board 22 to the island 90, which makes an anode connection to the diode 50*c*. Extending the pattern, islands 92, 96, 100, 104, 108, 112, 116, 120, 124 and 128 on face 22*b* provide cathode connections respectively for the diodes 50*d*, 50*e*, 50*f*, 50*g*, 50*h*, 50*i*, 50*j*, 50*k* and 50-1. Likewise, the islands 94, 98, 102, 106, 110, 114, 118, 122 and 126 on face 22*a* provide anode connections for the diodes 50*c*, 50*d*, 50*e*, 50*f*, 50*g*, 50*h*, 50*i*, 50*j*, 50*k* and 50-1.

It will be noted that if the emitter board 22 would be a transparent pane such as a pane of glass, the islands making anode and cathode connections would, as seen from one side of the board 22, appear to lap end-to-end thus forming a zigzag path serially connecting the first diode 50*a* to the last diode 50-1. A negative voltage connection to this zigzag path is made by means of the aforementioned conductor 67 which, in FIG. 4, extends from the island 128 to the collector for the transistor 62. The terminal 56 described in reference to FIG. 2 appears in FIG. 4 as a printed conductor 56 connected to the emitter of transistor 62 by the aforementioned resistor 68. It will be noted that the resistors 58 and 68, the transistor 62 and the Zener diode 70 are illustrated diagrammatically on the face 22*b* of the emitter board 22, when, in actual practice, these circuit elements may be discrete components physically mounted on the face 22*b* of the printed circuit board with wires and/or printed conductors completing the necessary circuit connections. Upon insertion of the emitter board 22 into its supporting socket 24, voltage conductors properly located along the length of the socket 24 will wipe the printed circuit terminals 52 and 56 so as to cause all of the diodes 50*a* through 50-1 to emit light directed toward the detector board 26.

Figure 7:
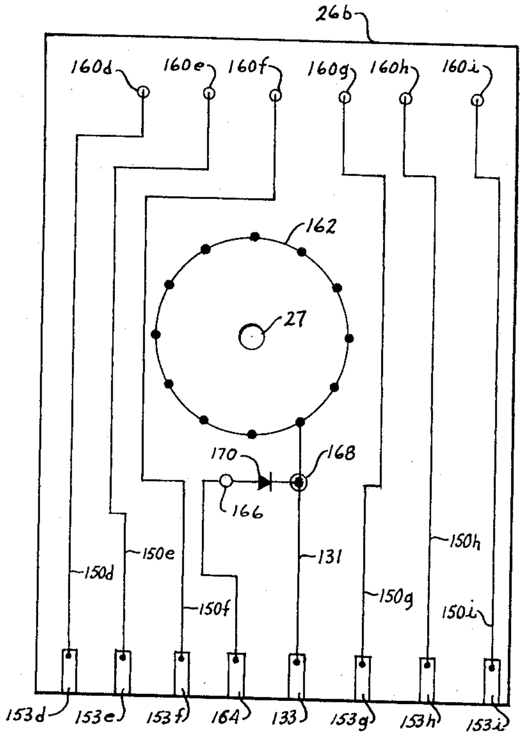
FIG. 7 is a plan view of the opposite face of the circuit board of FIG. 6, discrete components assembled to the circuit board being illustrated diagrammatically.

The opposite faces 26*a* and 26*b* of the detector board 26 are illustrated in FIGS. 6 and 7 respectively. The light detector elements supported by the board 26 comprise twelve photo-sensitive transistors identified by the reference numbers 130*a* through 130-1. As appears in FIG. 6, the transistors are arranged in a circular array at 30° intervals along the circumference of the array so as to encircle an aperture 27 passing through the board 26. Having reference to FIG. 1, the photo-sensitive transistors on the detector board 26 are positioned in confronting relation to the light-emitting diodes on the emitter board 22, the transistor 130*a* confronting the diode 50*a* and each of the other transistors confronting the diode having a like alphabetic suffix.

The circuitry associated with the detector board 26 by which any arbitrarily selected photo-sensitive transistor operates is schematically shown in FIG. 5. For convenience of description the circuitry is described with reference to the photo-sensitive transistor 130*a*. Also as a convenience, while neither the detector board 26 nor the socket 28 appears in FIG. 3, points of connection between the detector board 26 and its supporting socket 28 are symbolized in FIG. 5 by schematically illustrated contact members 132, 134 and 154 which wipe conductors 133, 136 and 153*a*, respectively, comprising portions of the detector board 26. It will thus be understood that circuitry illustrated in the lower portion of FIG. 5 is printed or mounted on the board 26 and circuitry illustrated in the upper portion of FIG. 5 is mounted or in some respect connected to the chassis 20.

Referring to FIG. 5, positive voltage made available at the contact member 132 within the chassis 20 is applied to a conductor 133 located on the detector board 26. A conductor 156 also applies the positive voltage to one side of a load device 152*a* which may be mounted to the chassis 20 or which may simply have a terminal connection to the chassis 20. The opposite end of the load device 152*a* is electrically connected to a contact 154 associated with the supporting socket 28 and adapted to wipe a conductor 153*a* on the circuit board 26.

The negative terminal for the voltage supply to the photo-sensitive transistor 130*a* is supplied from within the chassis 20 to a contact 134 associated with the socket 28 and adapted to wipe a conductor 136 located on the detector board 26.

As further appears in FIG. 5 the photo-sensitive transistor 130*a* has a collector 137, an emitter 135 and a base 139. The collector 137 is connected to the positive voltage supply through the aforementioned conductor 133. The emitter 135 is connected to the negative voltage supply through a resistor 138*a*. Upon exposure of the photo-sensitive transistor to an effective light, the transistor becomes conductive with the result that the positive supply voltage is dropped across the resistor 138*a*. The voltage thus appearing on the resistor 138*a* is applied through a conductor 140*a* to the base 142 of a current amplifier 144*a* mounted on the detector board 26. Those skilled in the art will recognize the current amplifier 144*a* as a Darlington amplifier comprising two transistors connected in tandem, the connection proceeding from the emitter of the first transistor to the base of the second transistor. The emitter 146 of the second transistor is connected to the negative side of the voltage supply by the conductor 136. The collector 147 of the second transistor is connected to the load 152*a* by the aforementioned conductor 153*a*. At such times as the photo-sensitive transistor 130*a* is exposed to an activating light, it is apparent that the voltage appearing on the resistor 138*a* is applied to the base 142 of the current amplifier 144*a* rendering the second transistor of the Darlington amplifier conductive with the result that substantially the entire voltage difference available between the contacts 132 and 134 is placed across the load 152*a*. As well understood, an interruption of the activating light will terminate the conductivity of the Darlington amplifier with the result that the application of voltage to the load 152*a* will be interrupted.

Since the circuitry illustrated in FIG. 5 has the capability of augmenting the output of the transistor 130*a* to a power level which will drive the load 152*a*, the circuitry is sometimes hereinafter referred to as a driver circuit.

The circuitry associated with the detector board 26 is more completely illustrated in FIGS. 6 and 7. FIG. 6 illustrates the face 26*a* of the board 26, this being the face which confronts the board 22. FIG. 7 illustrates the opposite face 26*b* of the board 26. No attempt has been made to illustrate the physical appearance of the photo-sensitive transistor devices inasmuch as devices suitable for the practice of the present invention are marketed by Motorola Semiconductor Products Division, Phoenix, Arizona under the model designation MRD 250.

In a fasion similar to that previously described with reference to the light-emitting diodes, the light-sensitive transistors are each provided with a metallic part which provides an emitter connection and which supports a lens for focusing the light received from a confronting light-emitting diode onto a photo-sensitive area of the transistor. A collector connection is made to the transistor opposite the lens side of the transistor. Emitter connections are thus made on the face 26*a* and collector connections on the face 26*b* of the detector board 26.

Referring particularly to the photo-sensitive transistor 130*c*, the emitter of this transistor is connected by a conductor 140*c*, which may be printed on the board 26, to the base of a Darlington amplifier 144*c* illustrated schematically in the lower right corner of the face 26*a*. The illustration of the Darlington amplifier 144*c* is characterized as schematic since the amplifier may, in fact, be a potted amplifier assembly mounted on the board 26. The resistor 138*a* appearing in FIG. 5 takes the form of the resistor 138*c* connected between the conductor 140*c* and the conductor 136 which has been printed on the detector board 26. The collector of the amplifier 144*c* is connected to a conductor 153*c* printed on the board 26.

Duplicate driver assemblies including the Darlington amplifiers 144*j*, 144*k*, 144-1, 144*a* and 144*b* have respectively associated resistors 138*j*, 138*k*, 138-1, 138*a* and 138*b* and are connected to the respective photo-sensitive transistors 130*j*, 130*k*, 130-1, 130*a* and 130*b* by conductors 140*j*, 140*k*, 140-1, 140*a* and 140*b* to supply load operating power to the respective load terminals 153*j*, 153*k*, 153-1, 153*a* and 153*b* printed on the face 26*a* of the printed circuit board 26.

There remain to be completed six additional driver connections for the photo-sensitive transistors 130*d*, 130*e*, 130*f*, 130*g*, 130*h* and 130*i*. The driver connection for the photo-sensitive transistor 130*d* is illustrated in the upper right of FIG. 6 and comprises a conductor 140*d* connecting from the emitter of the transistor 130*d* to the base of a Darlington amplifier 144*d*. A resistor 138*d* connects from the conductor 140*d* to the emitter of the Darlington amplifier and to the printed conductor 136. There remains to be completed a connection to the load to be driven by the amplifier 144*d*. This connection is made by means of a solder plug 160*d* passing through the thickness of the board 26 to its face 26*b*. This solder plug connects electrically to a conductor 150*d* which may be either printed or wired and which connects to a printed conductor 153*d* positioned for sliding engagement with a contact located in the socket 28. Duplicate driver connections are completed for the photo-sensitive transistors 130*e*, 130*f*, 130*g*, 130*h* and 130*i* by means of conductors 140*e*, 140*f*, 140*g*, 140*h* and 140*i* respectively leading to Darlington amplifiers 144*e*, 144*f*, 144*g*, 144*h* and 144*i*, having associated resistors 138*e*, 138*f*, 138*g*, 138*h* and 138*i*. The amplifiers 144*e*, 144*f*, 144*g*, 144*h* and 144*i* have associated solder plugs 160*e*, 160*f*, 160*g*, 160*h*, and 160*i* connected by conductors 150*e*, 150*f*, 150*g*, 150*h* and 150*i* respectively to load terminals 153*e*, 153*f*, 153*g*, 153*h* and 153*i*. The load terminals printed on the face 26*a* to have sliding contact to the socket 28 are staggered with respect to the load terminals printed on the face 26*b*, thus avoiding short-circuiting between the several circuits assembled on the board 26.

A common collector connection for each of the photo-sensitive transistors 130*a* – 130-1 is accomplished on the face 26*b* of the board 26 by means of a conductive ring 162 which encircles the aperture 27 in the board 26. A conductor 131 extending from the ring 162 to a printed conductor 133 adapted to engage the sliding contact 132 in the socket 28 connects the ring 162 to the positive power supply.

A connection to the negative side of the power supply is brought to the face 26*b* of the board 26 by means of a printed conductor 164 engaging an appropriate contact in the socket 28 and connecting to the solder junction 166. A similar soldered junction 168 is connected electrically to the conductor 131 and the two junctions 166 and 168 are bridged by a diode 170. The junctions 166 and 168 provide the previously described connections for the wires 32 and 30 associated with the stepping motor 38 and the diode 170 provides a discharge path for the operating coil of the stepping motor.

From the foregoing description it can be seen that the emitter board 22 is so connected to the chassis 20 that twelve light-emitting diodes are continuously energized so as to radiate light toward 12 photo-sensitive transistors located on the detector board 26. Associated with each of the photo-sensitive transistors is a load device such as shown at 152*a* in FIG. 5; and, in the absence of a selector mechanism, all 12 loads will be simultaneously energized. To obtain a circuit selectivity so as to allow the loads to be sequentially energized, one at a time, a generally opaque light shield 44 is interposed between the circuit boards 22 and 26 and drivingly connected to the output shaft 42 of the stepping motor 38. The output shaft 42 is preferably a double-D shaft having bearing support in the apertures 23 and 27 of the respective circuit boards 22 and 26. As appears in FIG. 8 the light shield has a double-D aperture 180 for driving engagement with the shaft 42. The light shield is in the shape of a drum whose axial length is sized to fit between, without rubbing against, the circuit boards 22 and 26. For reasons that will appear clear in the following remarks, the diameter of the drum only slightly exceeds the diameter of the light-emitter-diode array illustrated in FIG. 3.

A single aperture or opening 182 passes axially through the light shield 44 and is spaced from the axis of the shield a distance substantially equal to the radius of the light-emitting-diode array. The driving connection between the shaft 42 and the light shield 44 is so arranged with respect to the aperture 182 that, at the completion of each step of the motor 38, the aperture 182 will be axially aligned with one of the light-emitting diodes 50*a* through 50-1. The circle identified by the reference number 184 in FIG. 3 has been provided in the drawings to illustrate the approximate relationship between the aperture 182 and any one of the lenses covering the light-emitting diodes 50*a* - 50-1.

From the foregoing description it will be clear that at the end of each step of the stepping motor 38 the light shield 44 will allow one, and only one, of the photo-sensitive transistors 130*a* through 130-1 to be exposed to an activating light of sufficient intensity to render the transistor conductive. It will also be apparent that by 12 successive depressions of the push-button switch 34, each of the 12 load devices will be sequentially energized.

It will be noted, of course, that in the embodiments described there is no rest position provided for the light shield in which no load is being energized. Those skilled in the art will realize that this feature is merely a matter of circuit preference, it being possible to provide an "off" position by simply eliminating one of the load devices from the design.

The mechanism described in reference to FIGS. 1 through 8 can be characterized as a single pole 12 -throw switch. It can be further characterized as a break-before-make switch because the aperture 182 in the light shield is small in relation to the 30° step executed by the stepping motor 38. Accordingly, any circuit which is already made at the time the push-button switch 34 is depressed will be broken before the next succeeding circuit is energized.

FIGS. 9, 10 and 11 illustrate a modification adapted to accomplish a make-before-break switch function. The modification is accomplished simply by replacing the light shield 44 with the light shield 186 illustrated in FIG. 9. The light shield 186 is equipped with an elongated, arcuate aperture 188 subtending slightly more than 30° of circumference about the axis of the shield 186. As appears in FIG. 9 the shield 186 is keyed with respect to the shaft 42 such that at any rest position for the stepping motor 38 only a single light-emitting diode 50*a*-50-1 has a light path through the aperture 188. FIG. 10 illustrates the light shield 186 in transition from one rest position to the next adjacent rest position in the direction of the arrow there illustrated. Since the aperture 188 subtends slightly more than 30° of circumference about the rotary axis, there necessarily occurs an instant when an adjacent two of the light-emitting diodes both have a light path through the aperture 188 and, accordingly, there will be a position in which a new load circuit is being energized before the previously energized load circuit has been de-energized.

FIG. 11 illustrates the same light shield arrangement at the termination of the step which was in process in FIG. 10 and illustrates that the diode previously unshielded, as shown in FIG. 9, is now shielded and the next diode in order has been unshielded.

Although preferred embodiments of the invention have been described, it will be understood that within the purview of this invention various changes may be made in the form, details, proportion and arrangement of parts, the combinations thereof, and mode of operation, which generally stated consist in a device capable of carrying out the objects set forth, as disclosed and defined in the appended claims.

Having thus described my invention, I claim:

1. In a contactless switch mechanism for successively energizing load devices selected from a plurality of load devices, the combination comprising: a plurality of light detectors, there being a different light detector for each of said load devices, a source of light effective to energize said light detectors, each light detector, when energized, producing an electrical signal, a plurality of signal amplifiers, each signal amplifier continuously coupled between one of said load devices and one of said light detectors and operative to energize its coupled load device upon receiving an electrical signal from its coupled light detector, an emitter board, a detector board, and chassis means supporting said boards in confronting relation, said emitter board supporting said source of light and having means electrically connecting said source of light to said chassis means, said detector board supporting said light detectors in a first predetermined array confronting said light source, said detector board having means electrically connecting said light detectors to said chassis means, a generally opaque light shield having a light-transmitting opening, said light shield interposed between said light detectors and said source of light, and motive means to advance said light shield to successive positions in each of which said openings is aligned to admit light to different of said light detectors.

2. The switch mechanism of claim 1 in which said light source comprises a plurality of individual light emitters, there being one light emitter for each of said light detectors, said emitter board supporting said light emitters in a second predetermined array wherein each light emitter confronts an individual one of said light detectors.

3. The switch mechanism of claim 2 in which said first and second arrays are confronting co-axial circular arrays, said motive means comprising a stepping motor to rotate said light shield stepwise about the common axis of said circular arrays and means drivingly connecting said stepping motor to said light shield.

4. The switch mechanism of claim 3 in which said opening is spaced from said common axis a distance substantially equal to the radius of one of said circular arrays.

5. The switch mechanism of claim 4 in which said light emitters and said light detectors are arranged in confronting pairs at equal angular intervals along their respective circular arrays, said stepping motor adapted to step said light shield through rotary steps substantially equal in rotary angle to said angular intervals, said stepping motor adapted to align said opening between a different emitter and detector pair at the end of each rotary step thereof.

6. The switch mechanism of claim 5 wherein said opening is an aperture through said light shield and said aperture subtends an angle about said common axis which is smaller than the rotary step of said stepping motor.

7. A stepping switch of claim 5 in which said opening is an aperture through said light shield and said aperture subtends an angle about said common axis which exceeds the rotary step of said stepping motor.

8. The switch mechanism of claim 1 in which said light detectors are photo-sensitive transistors.

9. The switch mechanism of claim 8 in which each said signal amplifier is a current amplifier responsive to the passage of current through its coupled photo-sensitive transistor.

10. The switch mechanism of claim 1 in which said plurality of light detectors are mounted to one face of said detector board, said signal amplifiers are mounted to said one face of said detector board, said detector board having a voltage terminal on said one face, conductive means on said one face connecting said voltage terminal to each of said current amplifiers, said detector board having a plurality of load terminals printed thereon, there being one load terminal for each of said signal amplifiers, said circuit board supporting a plurality of conductors, there being a different conductor connecting each of said load terminals to a different one of said signal amplifiers, at least one of said load terminals printed on a face of said detector board which is different from the face to which at least one other of said load terminals is printed.

11. The switch mechanism of claim 10 in which any load terminals printed on one face of said detector board are staggered with respect to any load terminals printed on another face of said detector board.

12. The switch mechanism of claim 1 in which said emitter board includes conductor means series connecting said plurality of emitter devices, said conductor means passing through the thickness of said emitter board intermediate each pair of series-adjacent emitter devices.

13. The switch mechanism of claim 1 wherein said motive means includes a stepping motor and command means for initiating successive steps of said stepping motor.

14. The switch mechanism of claim 13 wherein said command means includes a manually operable switch device.

15. In a contactless switch mechanism for successively energizing load devices selected from a plurality of load devices, said mechanism comprising a plurality of light detectors, there being a different light detector connected to each of said load devices, a source of light effective to energize said light detectors, each light detector, when energized, producing an electrical signal, means for each light detector responsive to its electrical signal to energize its connected load device, a prime mover, and means driven by said prime mover to selectively admit light from said source to successively different light detectors, the improvement comprising a detector board, an emitter board, and chassis means supporting said detector and emitter boards in confronting relation, said emitter board supporting said source of light and having means electrically connecting said source of light to said chassis means, said detector board supporting said light detectors in a predetermined array confronting said light source, said detector board having means electrically connecting said light detectors to said chassis means, said means to selectively admit light from said source to successively different light detectors comprising a generally opaque light shield having a light transmitting opening, said light shield interposed between said emitter and detector boards.

* * * * *